(12) United States Patent
Hizal et al.

(10) Patent No.: US 9,660,619 B2
(45) Date of Patent: May 23, 2017

(54) HIGH VOLTAGE PULSE GENERATOR

(71) Applicant: ASELSAN ELEKTRONIK SANAYI VE TICARET ANONIM SIRKETI, Ankara (TR)

(72) Inventors: Mirzahan Hizal, Ankara (TR); Burak Isiktan, Ankara (TR); Cagdas Enis Doyuran, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 366 days.

(21) Appl. No.: 14/394,265

(22) PCT Filed: Apr. 2, 2013

(86) PCT No.: PCT/IB2013/052629
§ 371 (c)(1),
(2) Date: Oct. 13, 2014

(87) PCT Pub. No.: WO2013/153483
PCT Pub. Date: Oct. 17, 2013

(65) Prior Publication Data
US 2015/0108852 A1 Apr. 23, 2015

(30) Foreign Application Priority Data
Apr. 12, 2012 (TR) .................... 2012/04258

(51) Int. Cl.
H03K 3/00 (2006.01)
H03K 3/64 (2006.01)
H03K 3/537 (2006.01)

(52) U.S. Cl.
CPC .................... *H03K 3/537* (2013.01)

(58) Field of Classification Search
USPC ........................................... 307/108
See application file for complete search history.

(56) References Cited

U.S. PATENT DOCUMENTS 5,311,067 A * 5/1994 Grothaus ................ H03K 3/55
307/108
5,798,579 A 8/1998 McPhee

FOREIGN PATENT DOCUMENTS

| DE | 102004001782 | * | 8/2005 |
| GB | 389813 A | | 3/1933 |
| JP | S58139678 | | 8/1983 |
| SU | 792566 A1 | | 12/1980 |

* cited by examiner

Primary Examiner — Rexford Barnie
Assistant Examiner — Xuan Ly
(74) Attorney, Agent, or Firm — Gokalp Bayramoglu

(57) ABSTRACT

The present invention relates to a high voltage pulse generator which can operate for a long time and has high pulse frequency. In the preferred embodiment of the invention, the air stored in the air container is transmitted to the air duct by means of a hose over the regulator that adjusts the pressure and flow rate of the air. The air given into the air duct blows into the chamber through the nozzles. Then, this air is taken into this air duct by means of the nozzles placed on the other air duct and is transferred to the outer environment over an exhaust valve placed under the air duct. The air coming from the air container takes the place of the removed air.

6 Claims, 2 Drawing Sheets

HIGH VOLTAGE PULSE GENERATOR

FIELD OF THE INVENTION

Figure 1:
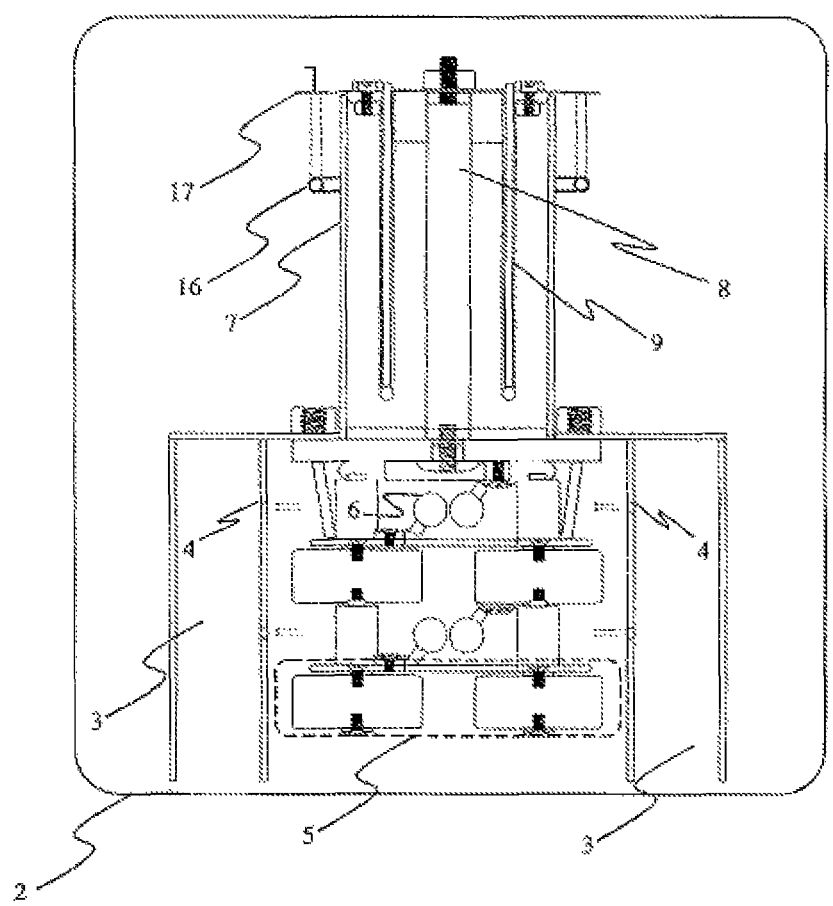

The present invention relates to a high voltage pulse generator Which enables to generate especially high voltage pulses consistently and in a high repetition rate

BACKGROUND OF THE INVENTION

High voltage pulse generators are used for purposes such as generating x rays and performing simulation of lightning discharges. These generators operate by connecting a number of capacitors, which in compact design, are installed in a chamber generally filled with insulating gas for high voltage insulation. After charging these capacitors in parallel they are connected and discharged to a load in series, by means of spark gaps. The spark gaps generally consist of conducting, spheres which are installed between the capacitors and adjusted for the desired value of the high voltage pulse output. In order to prevent any undesired discharges across the capacitors or from other high voltage conductors, the interior of the chamber is insulated by a suitable insulating gas medium. In the state of the art, this gas is sulfur hexafluoride (SF6) which is commonly used in high voltage equipment due to its electronegative properties. However, SF6 gas, although stable and satisfactory under normal insulating, applications where no discharges are expected undergoes chemical decomposition rapidly and irreversibly by the effect of the powerful electric arcs repeated frequently. As a result, besides other byproducts, solid sulfite particles are produced. This means both the contamination of the chamber and the consumption of the gas which is supposed to provide high voltage insulation. The decomposed gas can no longer perform its insulation function properly. As the number and frequency of the generated pulses increase, the gas is consumed more rapidly. Moreover, in order for the generator to continue to be used efficiently, it is necessary to clean the sulfur particles and to refill the chamber with fresh SF6 gas. This requires having carrying significant quantity of SF6 gas/tubes in the system for a reasonable operation time. Therefore, systems using SF6 are not economical and useful for they require maintenance in a short time and need an SF6 source.

Hence, generators using SF6 as insulation medium cannot be operated for a long duration due to the stated reasons.

U.S. Pat. No 5,798,579, an application known in the state of the art, discloses is high voltage pulse generator. The said document discloses the use of pressured hydrogen gas to maintain voltage stability in high pulse rates. This system is also a system with low practical applicability due to the cost of the system; extra scaling problems brought by the hydrogen gas, constant need for gas supply; flammability and explosion risks.

SUMMARY OF THE INVENTION

The objective of the present invention is to provide a high voltage pulse generator which can operate for a long time with maintained stability.

Another objective of the present invention is to provide a high voltage pulse generator having high firing frequency.

DETAILED DESCRIPTION OF THE INVENTION

Figure 2:
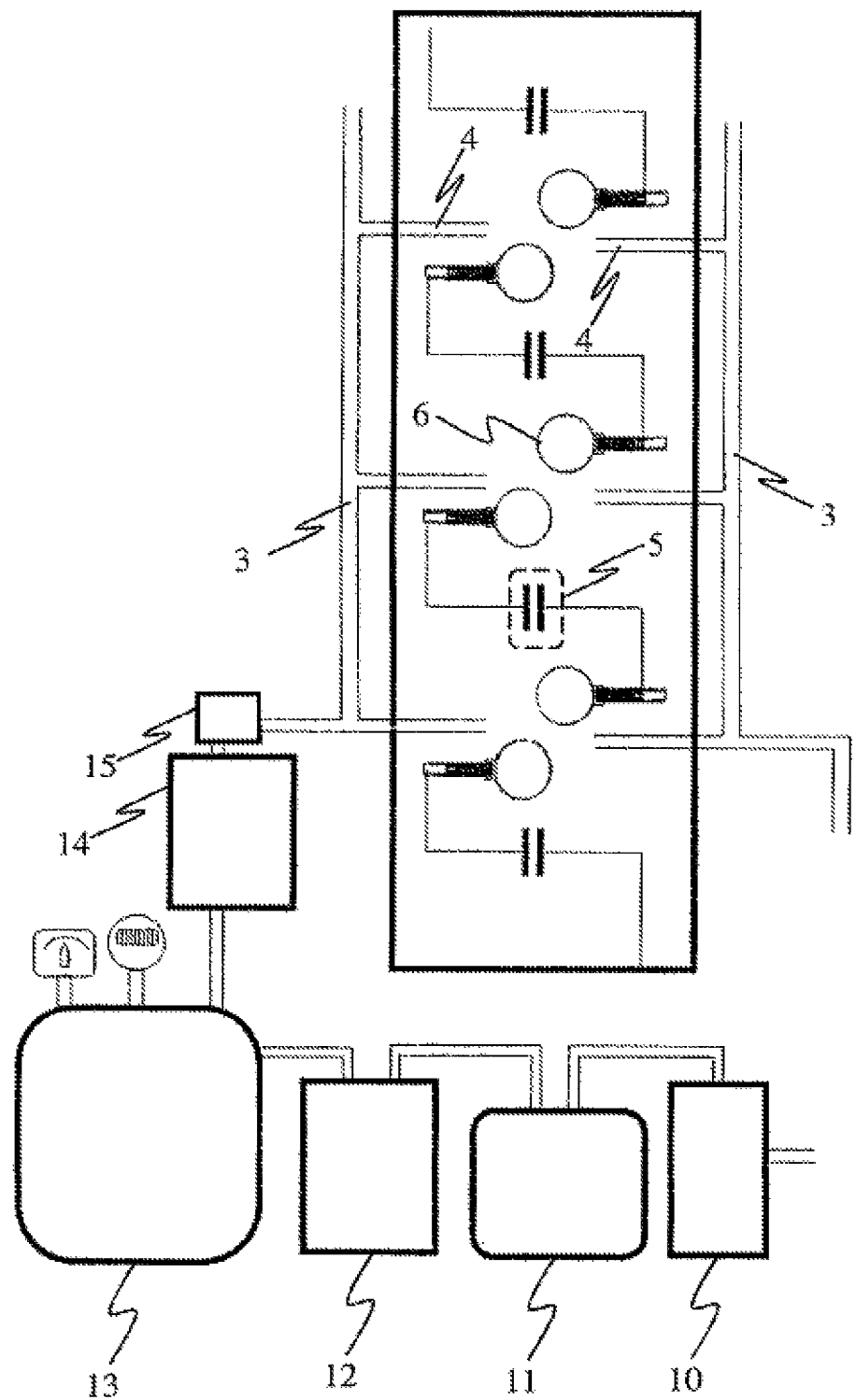

A high voltage, pulse generator developed to fulfill the objective, of the present invention is illustrated in the accompanying figures, in which, FIG. 1 is a view of the high voltage pulse generator.
FIG. 2 is another view of the high voltage pulse generator.
The components shown in the figures are each given reference numerals as follows:
1. High voltage pulse generator
2. Chamber
3. Air duct
4. Air nozzle
5. Capacitor
6. Electrode
7. Upper Chamber
8. Load resistance
9. Ground line
10. Filter
11. Compressor
12. Dryer
13. Air container
14. Heater
15. Regulator
16. First disc
17. Second disk The inventive high voltage pulse generator (1) essentially comprises

- at least one chamber (2) which is in the shape of a hollow cylinder,
- at least two air duct (3) which are placed in the chamber (3) and one of which enables to Now air into the chamber (2) while the other enables to take air from the chamber (2),
- at least two air nozzles (4) which are placed such that there will be one on the lateral surface of each air duct and which enable the air flow between the air duct (3) and the chamber (2),
- at least two capacitors (5) which are placed in the chamber (2) and enable to store charge,
- at least two electrodes (6) which are connected as one to every sequential capacitor (5) such that it will enable arcing from one capacitor (5) to the other and the distance between which can be adjusted according to the voltage value desired for the arc,
- at least one cylindrical upper chamber (7) which is in the chamber (2) and proceeds coaxial with the circular cross-section of the central chamber (2),
- at least one cylindrical load resistance (8) which proceeds coaxial such that it will connect the circular cross-sections of the upper chamber (7),
- at least one ground line (9) which enables the current passing through the load resistance (8) to be transmitted to earth,
- at least one filter (10) which enables foreign particles such as dust from the outer environment to be filtered,
- at least one compressor (11) which enables the air passing through the filter (10) to get pressurized,
- at least one dryer (12) which enables the air pressurized by the compressor (11) to get dried,
- at least one air container (13) wherein the pressurized air dried by the dryer is stored,
- at least one heater (14) which enables the air taken from the air container (13) to be heated,
- at least one regulator (15) which regulates the pressure and the flow rate of the air taken from the heater (14) and enables to give the air, whose pressure and flow rate is regulated, into the air duct (3) enabling to give an into the chamber (2), at least one conducting first disc (16) which is on the upper chamber (7) and proceeds such that it gets distant from the lateral surface of the chamber (2) in fine with the radius, at least one conducting second disc (17) which is at the end of the upper chamber (7) that is far from the capacitors (5) and placed in parallel with the first disc (16), In the preferred embodiment of the invention, in the chamber (2), there is a number of capacitors (5) positioned as one on the top of the other as groups (plate groups) consisting of two plates on the same plane with each other. Each capacitor consisting of two plates can be separated and insulated from the other by a spacer. In this embodiment, the distance between the capacitors (5) should be wide enough to prevent undesired electric discharges. In this embodiment, the plate group on the top is fixed to an acrylic insulator. In this embodiment, the air duct's (3) parts which are not connected to the air inlet hose and the valve are stabilized to this acrylic insulator.

In the preferred embodiment of the invention, at least one electrode (6) is connected. to the plates in order to facilitate the arc between the capacitors (5). Electrodes (6) are connected to both capacitors (5) consisting of two plates (plate group) each, and (one) to a plate in the lower group and to the plate, in the upper group, which is placed at the crosswise of the plate to which the electrode (6) is connected in the lower group. In this embodiment, the electrode (6) in each group can be adjusted by moving towards the electrode in the other group.

In the preferred embodiment of the invention, foreign particles such as dust in the air taken from the outer environment are separated by the filter (10). The pressure of the air filtered by the filter (10) is increased by the compressor (11). Order to reduce the amount of the humidity rate in the air that is taken, the air the pressure of which is increased is by the compressor is passed through the air dryer (12). After all, the air that is filtered, pressurized and dried is stored in the air container (13). In order to bring the temperature of the air taken from the air container (13) to the desired level, the air is passed through the heater (14). The air heated by the heater (14) is transmitted to the regulator (15) which enables to adjust the pressure and flow rate thereof. The air with constant flow rate, constant pressure and constant temperature is transmitted 10 the air duct (3). In this embodiment the air stored in the air container (13) is transmitted to the air duct (3) by means of a hose over the regulator (15) that adjusts the pressure and flow rate of the air. The air given into the air duct (3) blows into the chamber (2) through the nozzles (4) Then, this air is taken into this air duct (3) by means of the nozzles (4) placed on the other as duct (3) and is transferred to the outer environment over an exhaust valve placed under the air duct (3). In this embodiment, the flow rate of the air to flow into the chamber (2) is adjusted by the exhaust valve connected to the air duct (3). In this embodiment, the nozzles (4) are aligned with the place where the arc between electrodes (6) occurs and thus the air whose structure is affected because of the arc is removed. The air coming foam the air container (13) takes the place of the removed air. Thus, it is guaranteed that the character of the next arc is not changed.

In the preferred embodiment of the invention, the current passing over the load resistance (8) is transferred to the earth by means of the pound line (9). In this embodiment, the ground line (9) proceeds from the load resistance's (8) part far from the capacitors (5) toward the close part, such that there will be a distance between the load resistance (8) and itself. The ground line (9) proceeding along the load resistance (8) contacts a connection terminal at its end close to the capacitors. A second wound line (9) contacting this terminal proceeds in parallel with the other ground line with sufficient, distance from capacitors. Thus, the magnetic effects created in the upper chamber (7) by the current, proceeding along the ground line (9) in is minimized. In this embodiment, between the lines (9) placed in parallel with each other, there is an insulator in older to prevent the electrical discharges. The second ground line (9) ends at the upper chamber's (7) surface which is far from the capacitors (5).

In the preferred embodiment of the invention, there is a conducting first disc (16) which is on the upper chamber (7) and proceeds such that it will get distant from the lateral surface of the upper chamber (7) in line with the radius. There is at least, one conducting second disc (17) which is at the end of the upper chamber (7) that is far from the capacitors (5) and placed in parallel with the first disc (16). These discs (16, 17) that are in parallel with each other function as a capacitor. Thus, a capacitance occurs between the surface, where capacitors (5) connect the upper chamber (7), and the first disc (16). Moreover, also a capacitance occurs between the first disc (16) and the second disc (17). These two capacitances act as a capacitance divider which enables the voltage to be sampled and measured. In this embodiment, there is a terminal which enables the electrical connection that is necessary for the measurement to be done, between the first disc (16) and the second disc (17).

It is possible to develop various embodiments of the inventive high voltage pulse generator (1). The invention can not be limited to the examples described herein and it is essentially as defined in the claims.

The invention claimed is:

1. A high voltage pulse generator, comprising:
   a chamber which is in the shape of a hollow cylinder,
   at least two air ducts which are placed in the chamber, wherein one of the ducts enables to blow air into the chamber while the other enables to take air from the chamber,
   at least two capacitors wherein the capacitors are placed in the chamber and enable to store electric charges,
   at least two electrodes wherein the electrodes are connected as one to every sequential capacitor to establish arcing from one capacitor to the other, and wherein the distance between the electrodes can be adjusted according to the voltage value desired for the arc,
   at least one cylindrical upper chamber wherein the cylindrical upper chamber is in the chamber and coaxially extends with the circular cross-section of the central chamber,
   at least one cylindrical load resistance wherein the cylindrical load resistance extends in the circular cross-sections of the upper chamber,
   at least two air nozzles wherein each of the air nozzle is placed on the lateral surface of each air duct and which enable the air flow between the air duct and the chamber, wherein and the air nozzles are aligned with the place where the arc between electrodes occurs,
   at least one ground line wherein the ground line enables the current passing through the load resistance to be transmitted to earth, wherein the ground line proceeding along the load resistance contacts a connection terminal at the ground line's end close to the capacitors,
   at least one filter wherein the filter enables foreign particles such as dust from the outer environment to be filtered, at least one compressor wherein the compressor enables the air passing through the filter to get pressurized, at least one dryer wherein the dryer enables the air pressurized by the compressor to get dried, at least one air container wherein the pressurized air dried by the dryer is stored, at least one heater wherein the heater enables the air taken from the air container to be heated, at least one regulator wherein the regulator regulates the pressure and the flow rate of the air taken from the heater and enables to give the air, whose pressure and flow rate is regulated, into the air duct enabling to give air into the chamber.

2. The high voltage pulse generator according to claim 1, which comprises a second ground line, wherein the second ground line contacts the connection terminal and extends towards the ground line in parallel such that it will get distant from capacitors, ends at the upper chamber's surface wherein the upper chamber's surface is far from the capacitors.

3. The high voltage pulse generator according to claim 1 which comprises at least one conducting first disc and at least one conducting second disc, wherein the conducting first disc is on the tipper chamber and proceeds such that it gets distant from the lateral surface of the chanter in line with the radius, wherein the conducting second disc is at the end of the upper chamber and placed in parallel with the first disc-for forming a capacitive voltage divider.

4. The high voltage pulse generator according to claim 1, which comprises at least one conducting first disc and at least one conducting second disc, wherein the conducting first disc is on the upper chamber and proceeds such that it gets distant from the lateral surface of the chamber in line with the radius, wherein the conducting second disc is at the end of the upper chamber and placed in parallel with the first dis for forming a capacitive voltage divider.

5. The high voltage pulse generator according to claim 2, which comprises at least one conducting first disc and at least one conducting second disc, wherein the conducting first disc is on the upper chamber and proceeds such that it gets distant from the lateral surface of the chamber in line with the radius, wherein the conducting second disc is at the end of the upper chamber and placed in parallel with the first dis for forming a capacitive voltage divider.

6. The high voltage pulse generator according to claim 1, wherein the foreign particles can be dust.

* * * * *